US010670487B2

(12) United States Patent
Nakashima

(10) Patent No.: US 10,670,487 B2
(45) Date of Patent: Jun. 2, 2020

(54) WATER LEAKAGE DETECTION SYSTEM FOR LASER DEVICE

(71) Applicant: FANUC CORPORATION, Yamanashi (JP)

(72) Inventor: Jun Nakashima, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 130 days.

(21) Appl. No.: 16/047,180

(22) Filed: Jul. 27, 2018

(65) Prior Publication Data

US 2019/0072450 A1 Mar. 7, 2019

(30) Foreign Application Priority Data

Sep. 5, 2017 (JP) .................................. 2017-170221

(51) Int. Cl.
*G01N 25/56* (2006.01)
*G01M 3/00* (2006.01)
(Continued)

(52) U.S. Cl.
CPC ........... *G01M 3/002* (2013.01); *B23K 26/703* (2015.10); *G01N 25/56* (2013.01); *G01N 25/66* (2013.01)

(58) Field of Classification Search
CPC ...... G06F 2200/201; G06F 1/206; G06F 1/20; H05K 7/20763; H05K 7/20218;
(Continued)

(56) References Cited

U.S. PATENT DOCUMENTS 6,387,286 B1* 5/2002 Takigawa ................ H01S 5/024
216/41
7,050,299 B2* 5/2006 Kondo ...................... G06F 1/20
165/104.33
(Continued)

FOREIGN PATENT DOCUMENTS

CN 101465509 A 6/2009
CN 202333428 U 7/2012
(Continued)

OTHER PUBLICATIONS

An Office Action mailed by the Japanese Patent Office dated Jun. 18, 2019, which corresponds to Japanese Patent Application No. 2017-170221 and is related to U.S. Appl. No. 16/047,180; with English translation.
(Continued)

*Primary Examiner* — Gail Kaplan Verbitsky
(74) *Attorney, Agent, or Firm* — Studebaker & Brackett PC

(57) ABSTRACT

A water leakage detection system for a laser device detects a water leakage in the laser device including: a part group for outputting laser light; a water cooling plate which cools at least a portion of the part group; an enclosed housing in which the part group and the water cooling plate are stored; and an air circulating unit which circulates air within the housing, the air circulating unit is provided in the vicinity of a part having high heat generation and the water leakage detection system for the laser device includes: a humidity detection unit which detects humidity within the housing; temperature detection units which are arranged in a plurality of places in the water cooling plate and which respectively detect the temperatures of the places; and a detection control unit which outputs detection information when the humidity acquired from the humidity detection unit exceeds reference humidity or when at least one of the temperatures acquired
(Continued)

from the temperature detection units exceeds a reference temperature of the corresponding place.

4 Claims, 11 Drawing Sheets

(51) Int. Cl.
  *B23K 26/70* (2014.01)
  *G01N 25/66* (2006.01)
(58) Field of Classification Search
  CPC ........... H05K 7/20381; H05K 7/20509; H05K 7/20836; G01N 25/56; G01N 27/121; G01N 27/223; G01N 25/66; G01N 21/81; G01N 2201/1211; G01M 3/002; B23K 26/763
  USPC ........... 374/4, 5, 29, 30, 137, 16, 28; 702/51
  See application file for complete search history.

(56) References Cited

U.S. PATENT DOCUMENTS

| | | | |
|---|---|---|---|
| 2003/0021312 A1 | 1/2003 | Gruzdev et al. | |
| 2005/0078450 A1* | 4/2005 | Ohashi | F28F 1/22 361/699 |
| 2017/0118872 A1* | 4/2017 | Stark | F25B 41/065 |
| 2018/0188133 A1* | 7/2018 | Cader | G01M 3/40 |
| 2019/0331130 A1* | 10/2019 | Lofy | F04D 29/281 |

FOREIGN PATENT DOCUMENTS

| | | | |
|---|---|---|---|
| CN | 105870765 A | | 8/2016 |
| JP | S60-063963 U1 | | 5/1985 |
| JP | S61071684 A | | 4/1986 |
| JP | H03-052278 A | | 3/1991 |
| JP | H04-023372 A | | 1/1992 |
| JP | H06260708 A | | 9/1994 |
| JP | 408088493 A | * | 4/1996 |
| JP | 2003-060268 A | | 2/2003 |
| JP | 2003-218435 A | | 7/2003 |
| JP | 2006-196644 A | | 7/2006 |
| JP | 2010135704 A | | 6/2010 |
| JP | 2012-059993 A | | 3/2012 |
| JP | 2013113778 A | | 6/2013 |
| JP | 2017005141 A | | 1/2017 |
| JP | 2017103414 A | | 6/2017 |

OTHER PUBLICATIONS

An Office Action mailed by the Japanese Patent Office dated Nov. 5, 2019, entitled "Decision to Grant a Patent" which corresponds to Japanese Patent Application No. 2017-170221 and is related to U.S. Appl. No. 16/047,180.

An Office Action mailed by the State Intellectual Property Office of the People's Republic of China dated Mar. 16, 2020, which corresponds to Chinese Patent Application No. 201811022776.8 and is related to U.S. Appl. No. 16/047,180.

* cited by examiner

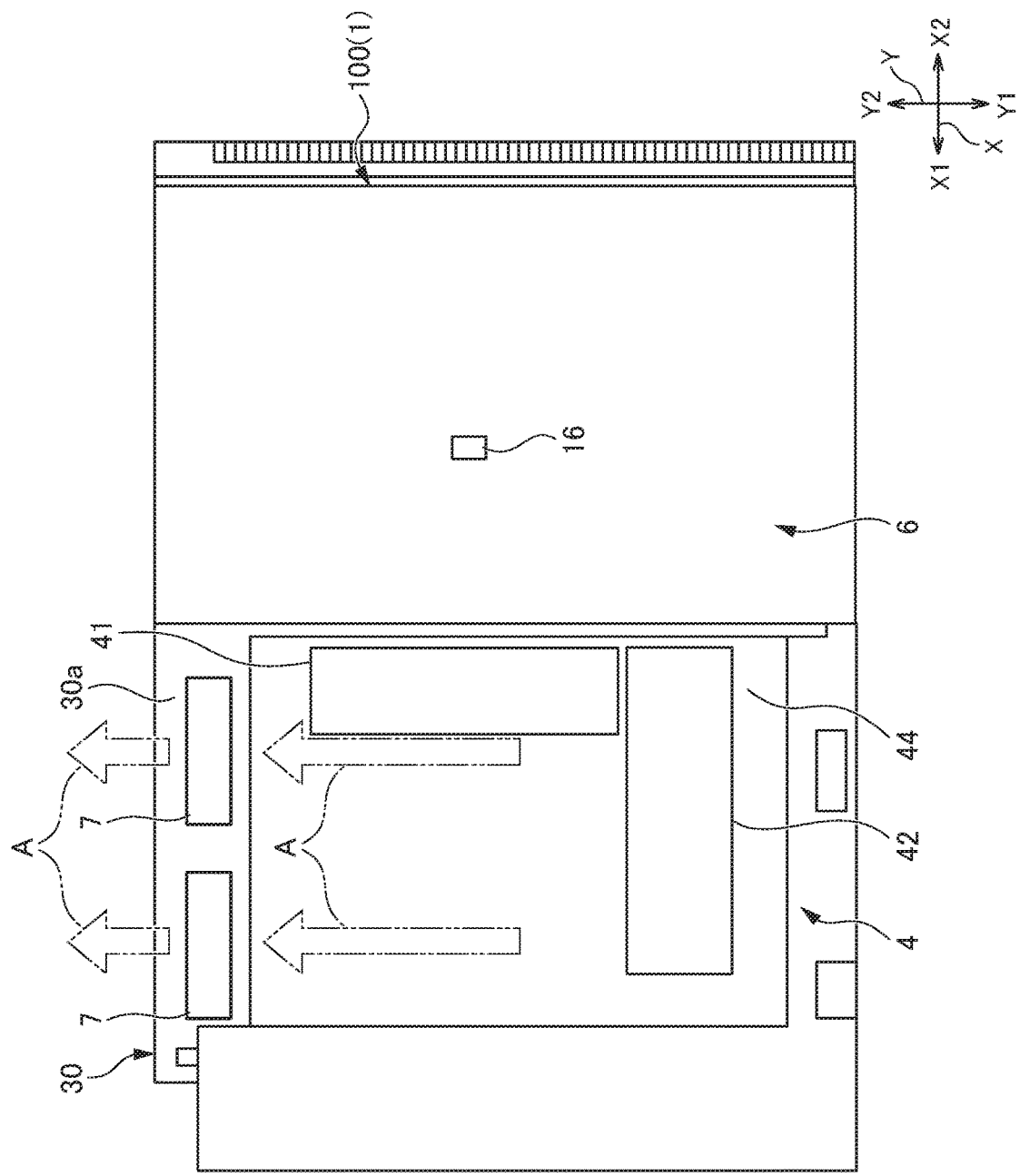

WATER LEAKAGE DETECTION SYSTEM FOR LASER DEVICE

This application is based on and claims the benefit of priority from Japanese Patent Application No. 2017-170221, filed on 5 Sep. 2017, the content of which is incorporated herein by reference.

BACKGROUND OF THE INVENTION

Field of the Invention

The present invention relates to a water leakage detection system for a laser device.

Related Art

Conventionally, laser light is used for cutting, welding or the like of metal or nonmetal. A laser device which outputs this type of laser light includes, therewithin, a part (hereinafter also referred to as a heat-generating part) having high heat generation. Hence, while the laser device is being operated, it is necessary to cool the heat-generating part. Conventionally, in the laser device, in order to cool the heat-generating part, a cooling unit such as a water cooling plate where a cooling water pipe along which cooling water is circulated and a water cooling pipe are embedded is provided. When water leaks in the cooling unit, the cooling performance of a portion where water leaks is lowered, and thus it is impossible to appropriately cool the heat-generating part. Hence, a device is proposed in which a humidity sensor is provided within a laser device and in which based on a variation in humidity detected with the humidity sensor, whether or not water leaks in a cooling unit is detected (see, for example, Patent Documents 1 to 3).

Patent Document 1: Japanese Unexamined Utility Model Application, Publication No. S60-063963

Patent Document 2: Japanese Unexamined Patent Application, Publication No. H04-23372

Patent Document 3: Japanese Unexamined Patent Application, Publication No. 2003-60268

SUMMARY OF THE INVENTION

When a small amount of water leaks from the cooling unit, humidity within the laser device is not significantly varied. Hence, in the water leakage detection using the humidity sensor, it takes much time to detect water leakage. When it takes much time to detect water leakage, since the amount of water vapor within the laser device is increased, a part group arranged therewithin may be affected. In the laser device, after the detection of water leakage, it is required to rapidly remove water droplets left therewith such as by condensation so as to restore the device in an early stage.

An object of the present invention is to provide a water leakage detection system for a laser device which can detect a small amount of water leaking within the laser device in an early stage and which can restore the laser device in an early stage.

(1) The present invention relates to a water leakage detection system for a laser device (for example, a water leakage detection system 10 which will be described later) that detects a water leakage in the laser device (for example, a laser device 1 which will be described later) including: a part group for outputting laser light; a water cooling plate (for example, a water cooling plate 30 which will be described later) which cools at least a portion of the part group; an enclosed housing (for example, an housing 20 which will be described later) in which the part group and the water cooling plate are stored; and an air circulating unit (for example, a fan motor 7 which will be described later) which circulates air within the housing, where the air circulating unit is provided in the vicinity of a part (for example, a power supply unit 4 which will be described later) having high heat generation among the part group, and the water leakage detection system for the laser device includes: a humidity detection unit (for example, a humidity sensor 16 which will be described later) which detects humidity within the housing; a plurality of temperature detection units (for example, temperature sensors 17a to 17g which will be described later) which are arranged in a plurality of places in the water cooling plate and which respectively detect the temperatures of the places; and a control unit (for example, a detection control unit 14 which will be described later) which outputs detection information when the humidity acquired from the humidity detection unit exceeds reference humidity or when at least one of the temperatures acquired from the temperature detection units exceeds a reference temperature of the corresponding place.

(2) Preferably, in the water leakage detection system for the laser device according to (1), the air circulating unit includes a mechanism in which air sucked within the housing is fed out into the housing, and the humidity detection unit is provided in a position away from the distribution path of the air sucked by the air circulating unit and the air fed out from the air circulating unit.

(3) Preferably, in the water leakage detection system for the laser device according to (1) or (2), the temperature detection units are respectively provided in the vicinity of the parts having high heat generation among the part group arranged on the water cooling plate.

(4) Preferably, in the water leakage detection system for the laser device according to any one of (1) to (3), when at least one of the temperatures acquired from the temperature detection units exceeds the reference temperature of the corresponding place, the control unit outputs, together with the detection information, position information associated with the temperature detection unit that detects the temperature exceeding the reference temperature.

According to the present invention, it is possible to provide a water leakage detection system for a laser device which can detect a small amount of water leaking within the laser device in an early stage and which can restore the laser device in an early stage.

BRIEF DESCRIPTION OF THE DRAWINGS

FIG. 4 is a plan view showing a main body unit 100 of the laser device 1;

DETAILED DESCRIPTION OF THE INVENTION

Figure 1:
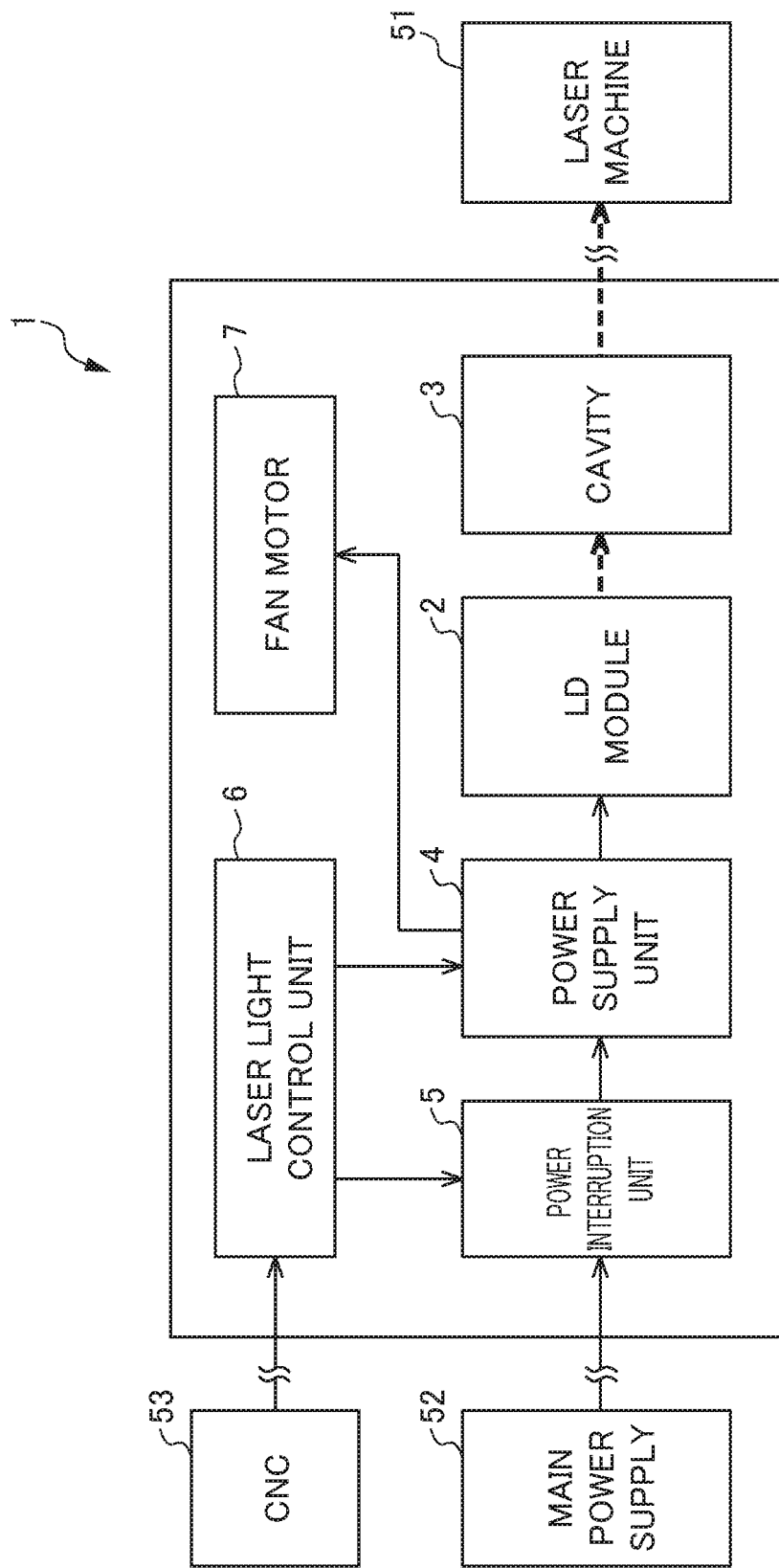
FIG. 1 is a block diagram showing a functional configuration of a laser device 1 in an embodiment.

An embodiment of the present invention will be described below. All drawings attached to the present specification are schematic views, and with consideration given to ease of understanding and the like, the shapes, the scales, the vertical and lateral dimension ratios and the like of individual portions are changed or exaggerated from real things. In the drawings, hatching indicating cross sections of members is omitted as necessary.

In the present specification and the like, one lateral direction in a laser device 1 is assumed to be an X (X1-X2) direction, and the other lateral direction orthogonal to the X direction is assumed to be a Y (Y1-Y2) direction. Here, for example, the one lateral direction corresponds to the longitudinal direction of a housing 20 which will be described later, and the other lateral direction corresponds to the lateral direction of the housing 20. The thickness direction (direction orthogonal to an X-Y plane) of the laser device 1 is assumed to be a Z (Z1-Z2) direction. The shape when the laser device 1 is seen in the thickness direction (Z direction) is not limited to a rectangle having the longitudinal direction and the lateral direction as in the present embodiment, and may be, for example, a square, a trapezoid or the like.

FIG. 1 is a block diagram showing a functional configuration of the laser device 1 in the present embodiment. In FIG. 1, arrows with thin lines represent electrical cables (cables for signals, power and the like). Arrows with thick lines (dotted lines) represent optical fiber cables.

The laser device 1 is a device which supplies laser light to a laser machine 51. As shown in FIG. 1, the laser device 1 includes, as a part group for outputting the laser light, an LD module 2, a cavity 3, a power supply unit 4, a power interruption unit 5 and a laser light control unit 6. The laser device 1 also includes a fan motor (air circulating unit) 7 which serves as a mechanism for circulating air within the housing 20 (which will be described later). Among them, the LD module 2, the cavity 3 and the power supply unit 4 are heat-generating parts (parts having high heat generation). The heat-generating part is, for example, the part which needs to be cooled by water or air because its temperature exceeds a rated temperature of the part itself without the part being cooled when the heat-generating part is energized. Since the heat-generating part continues to be used beyond the rated temperature or around the upper limit value of the rated temperature such that the life of the part is significantly reduced, it is necessary to reduce the temperature of the part.

Although not shown in FIG. 1, within the laser device 1, a humidity sensor 16, temperature sensors 17, a water cooling plate 30 and the like which will be described later are arranged. In the following description, a form in which the individual units forming the laser device 1 are assembled as one unit is also referred to as a "main body unit 100".

The LD module 2 is the laser light source which generates the laser light. The LD module 2 is formed with a plurality of laser diodes (unillustrated). The LD module 2 generates the laser light whose intensity corresponds to a current supplied from the power supply unit 4. The laser light generated in the individual laser diodes is fed out through the optical fiber cable to the cavity 3. Since the LD module 2 is a heat-generating part, as will be described later, the LD module 2 is arranged on a first cooling surface 30a of the water cooling plate 30.

The cavity 3 is the part which amplifies the laser light fed out from the LD module 2. The laser light generated in the individual laser diodes is amplified in the cavity 3 and is output through the optical fiber cable to the laser machine 51 in the outside. The laser machine 51 is the device which emits the laser light from a cutting head (unillustrated) so as to machine a work. Since the cavity 3 is a heat-generating part, as will be described later, the cavity 3 is arranged on a second cooling surface 30b of the water cooling plate 30.

The power supply unit 4 is the power supply circuit which supplies a current for generating the laser light in the LD module 2 and which supplies a drive current to the fan motor 7. The power supply unit 4 supplies the current to the LD module 2 and stops the supply according to a control signal fed out from the laser light control unit 6. The power supply unit 4 also supplies the current to the fan motor 7 and stops the supply according to a control signal fed out from the laser light control unit 6. The power supply unit 4 is formed with heat-generating parts such as a coil 41, a capacitor 42 and a switching element (for example, an FET) 43 which will be described later. Since the power supply unit 4 is a heat-generating part, a portion thereof is cooled by the water cooling plate 30.

The power interruption unit 5 is the circuit which can interrupt the supply of the current from the power supply unit 4 to the LD module 2. The power interruption unit 5 is the circuit which includes, for example, electrical parts such as a fuse and a breaker. The power interruption unit 5 is connected to the power supply unit 4 and a main power supply 52 through the electrical cables. The power interruption unit 5 is operated so as to supply power from the main power supply 52 to the power supply unit 4 when the laser device 1 is operated and to interrupt the supply of the current from the power supply unit 4 to the LD module 2 according to the control signal fed out from the laser light control unit 6 at the time of emergency.

The laser light control unit 6 is the circuit which controls the output of the laser light from the laser device 1. The laser light control unit 6 outputs the control signals through the electrical cables so as to control the operations of the power supply unit 4 and the power interruption unit 5. The laser light control unit 6 is connected to a CNC 53 through the electrical cable. The CNC 53 is the numerical controller which controls the operation of the laser device 1. The laser light control unit 6 controls the operations of the power supply unit 4 and the power interruption unit 5 according to the control signals fed out from the CNC 53. In the laser light control unit 6, the humidity sensor 16 which will be described later is arranged.

The fan motor 7 is the blower in which a fan and a motor are integrated. In the fan motor 7, the fan is operated with the motor, and thus air sucked within the housing 20 (which will be described later) is fed out into the same housing 20. In this way, the fan motor 7 can circulate the air within the housing 20. The fan motor 7 is driven by the current supplied from the power supply unit 4. The fan motor 7 of the present embodiment is arranged in the vicinity of the coil 41 (which will be described later) that is a heat-generating part of the power supply unit 4. The arrangement of the fan motor 7 within the laser device 1 will be described later.

Figure 2:
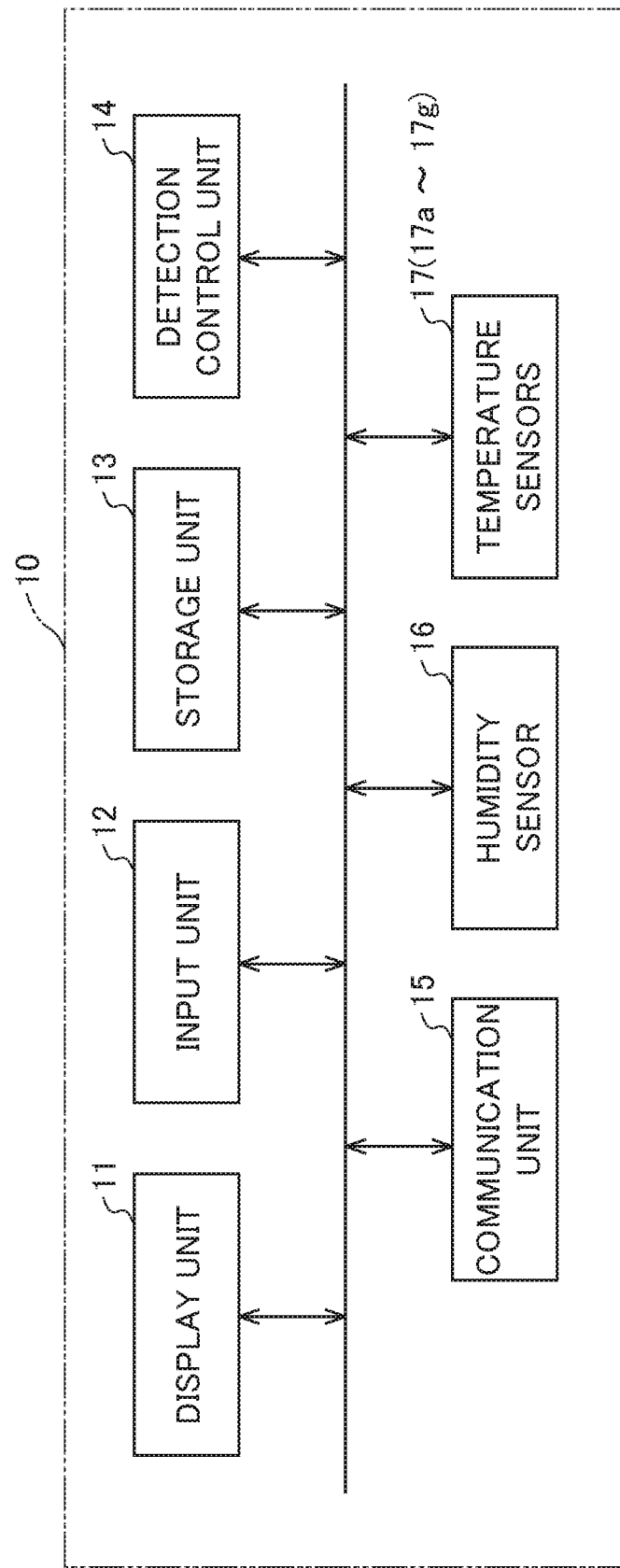
FIG. 2 is a block diagram showing the configuration of a water leakage detection system 10.

The configuration of a water leakage detection system 10 which detects the water leakage of the laser device 1 will then be described. FIG. 2 is a block diagram showing the configuration of the water leakage detection system 10. The water leakage detection system 10 is the system for detecting the water leakage of the water cooling plate 30 (which will be described later) arranged within the laser device 1.

As shown in FIG. 2, the water leakage detection system 10 includes a display unit 11, an input unit 12, a storage unit 13, a detection control unit 14, a communication unit 15, the humidity sensor (humidity detection unit) 16 and the temperature sensors (temperature detection units) 17. In the water leakage detection system 10, the display unit 11, the input unit 12, the storage unit 13, the detection control unit 14 and the communication unit 15 are formed with, for example, a personal computer.

The display unit 11 is the display device which can display a warning message or the like when the water leakage is detected in the laser device 1. The input unit 12 is the device which can input, to the detection control unit 14, not only various types of characters and numerical data but also a manipulation instruction, an operation instruction and the like. The input unit 12 is formed with, for example, a keyboard, a mouse, a touch panel and the like (unillustrated). The storage unit 13 is the storage device in which programs, data and the like executed in the detection control unit 14 are stored. In the storage unit 13, reference humidity, partial reference temperatures, identification information, position information and the like are stored. The storage unit 13 is formed with, for example, a semiconductor memory, a hard disk and the like.

The reference humidity is the threshold value of humidity which is referenced when whether or not water leaks within the housing 20 is determined. The reference humidity is set based on an average humidity within the housing 20 while the laser device 1 is being operated. The partial reference temperatures are the threshold values of temperatures when whether or not water leaks in places where the temperature sensors 17 (which will be described later) are arranged is determined. The partial reference temperature is set based on an average temperature in the place while the laser device 1 is being operated.

The position information is the information on the positions of the places in which the individual temperature sensors 17 are arranged. The pieces of position information are stored so as to be associated with the pieces of identification information allocated to the individual temperature sensors 17. Hence, when the piece of identification information of the temperature sensor is found, the position information of the place in which the temperature sensor is provided is found. For example, when the temperature sensors are provided in non-overlapping positions in the thickness direction (Z direction) of the laser device 1, the position information can be indicated by the coordinate information of the laser device 1 on the X-Y plane. Instead of the coordinate information, for example, the position information can be indicated by character information including specific names such as the "vicinity of optical parts 8".

The detection control unit 14 is the unit which comprehensively controls the operation of the water leakage detection system, and is formed with a microprocessor including a CPU (central processing unit) and a memory. The detection control unit 14 reads operating and application programs from the storage unit 13 and executes them so as to realize various types of functions in cooperation with individual pieces of hardware. When an environmental humidity acquired from the humidity sensor 16 exceeds the reference humidity stored in the storage unit 13, the detection control unit 14 makes the display unit 11 display the warning message (warning information). When at least one of partial temperatures acquired from the temperature sensors 17 exceeds the partial reference temperature in the corresponding place, the detection control unit 14 makes the display unit 11 display, together with the warning message, the position information associated with the temperature sensor 17 which detects the partial temperature exceeding the partial reference temperature. Water leakage detection processing which is performed in the detection control unit 14 will be described later.

The communication unit 15 is the communication interface for transmitting and receiving data to and from an external device (for example, a management device or a portable terminal including a database) through a network. Detection information is transmitted from the communication unit 15 through the network to the external device, and thus the detection information output from the water leakage detection system 10 can be confirmed with the remote external device.

The humidity sensor 16 is the part which detects, as the environmental humidity, the humidity within the housing 20 (which will be described later). The humidity detected in the humidity sensor 16 is transmitted to the detection control unit 14 as the environmental humidity (which is represented by Ha to be described later). As the humidity sensor 16, for example, when it is an electrical type, a humidity sensor of a resistance variation type or a capacitance variation type can be mentioned. In the laser device 1, the position in which the humidity sensor 16 is arranged will be described later.

The temperature sensors 17 are the parts which detect the temperatures of the water cooling plate 30 (which will be described later) stored in the laser device 1. In the present embodiment, the temperature sensors 17 are formed with seven temperature sensors 17a to 17g. The temperature sensors 17a to 17g are arranged in seven different places on the water cooling plate 30. The temperatures detected in the temperature sensors 17a to 17g are respectively transmitted as partial temperatures (which are represented by T1 to T7 to be described later) to the detection control unit 14.

The pieces of identification information (such as manufacturing numbers) are respectively allocated to the temperature sensors 17a to 17g. Then, the pieces of identification information are respectively associated with the pieces of position information of the temperature sensors 17a to 17g. Hence, based on the pieces of identification information of the temperature sensors 17a to 17g, the pieces of position information of the places in which the temperature sensors are provided can be identified. As the temperature sensor 17, for example, when it is a resistance type, a temperature sensor using a resistance temperature detector, a thermistor or the like can be mentioned. In the laser device 1, the places in which the temperature sensors 17 are arranged will be described later.

Figure 3:
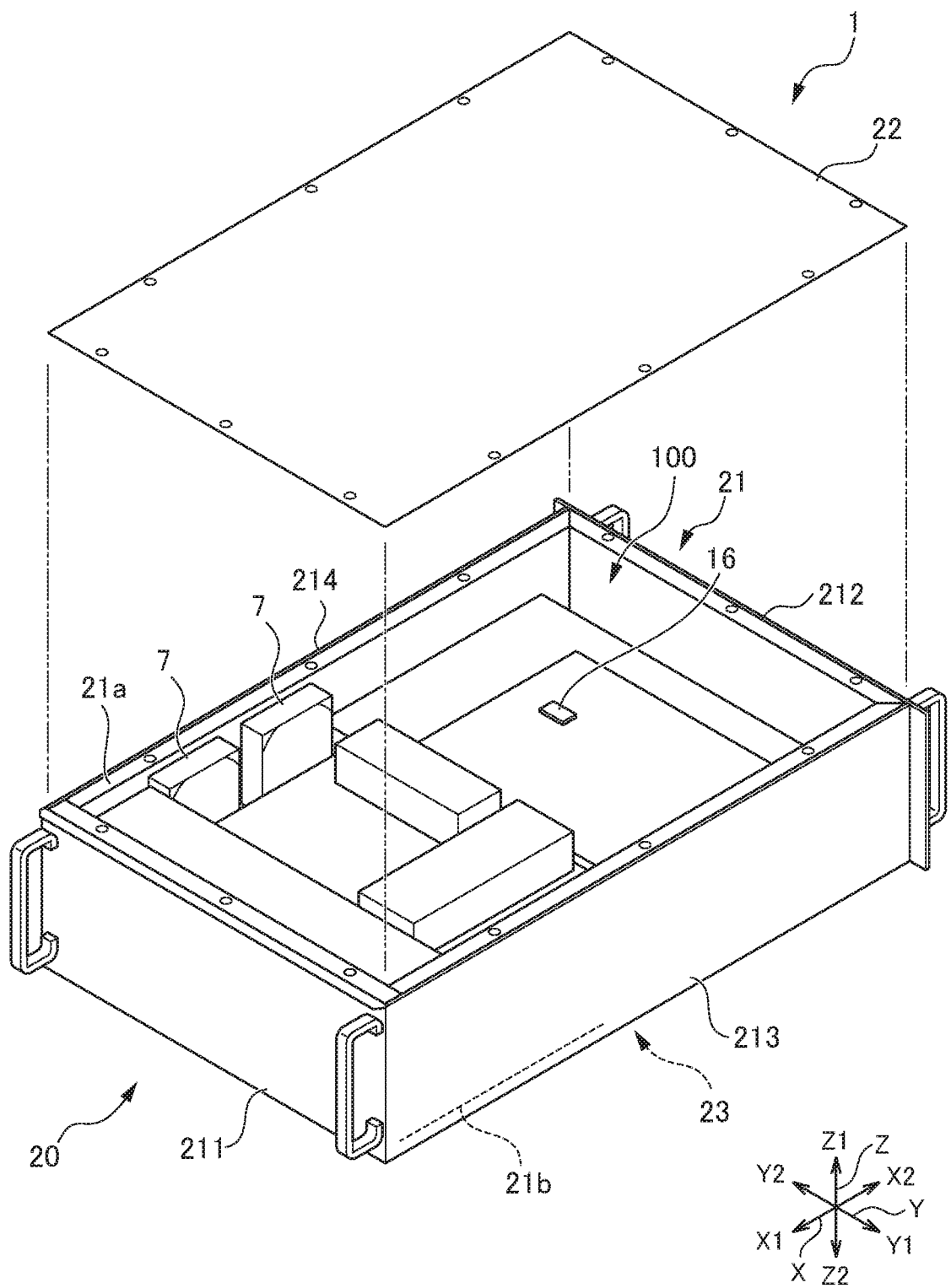
FIG. 3 is an exploded perspective view showing the appearance of the laser device 1.
Figure 5A:
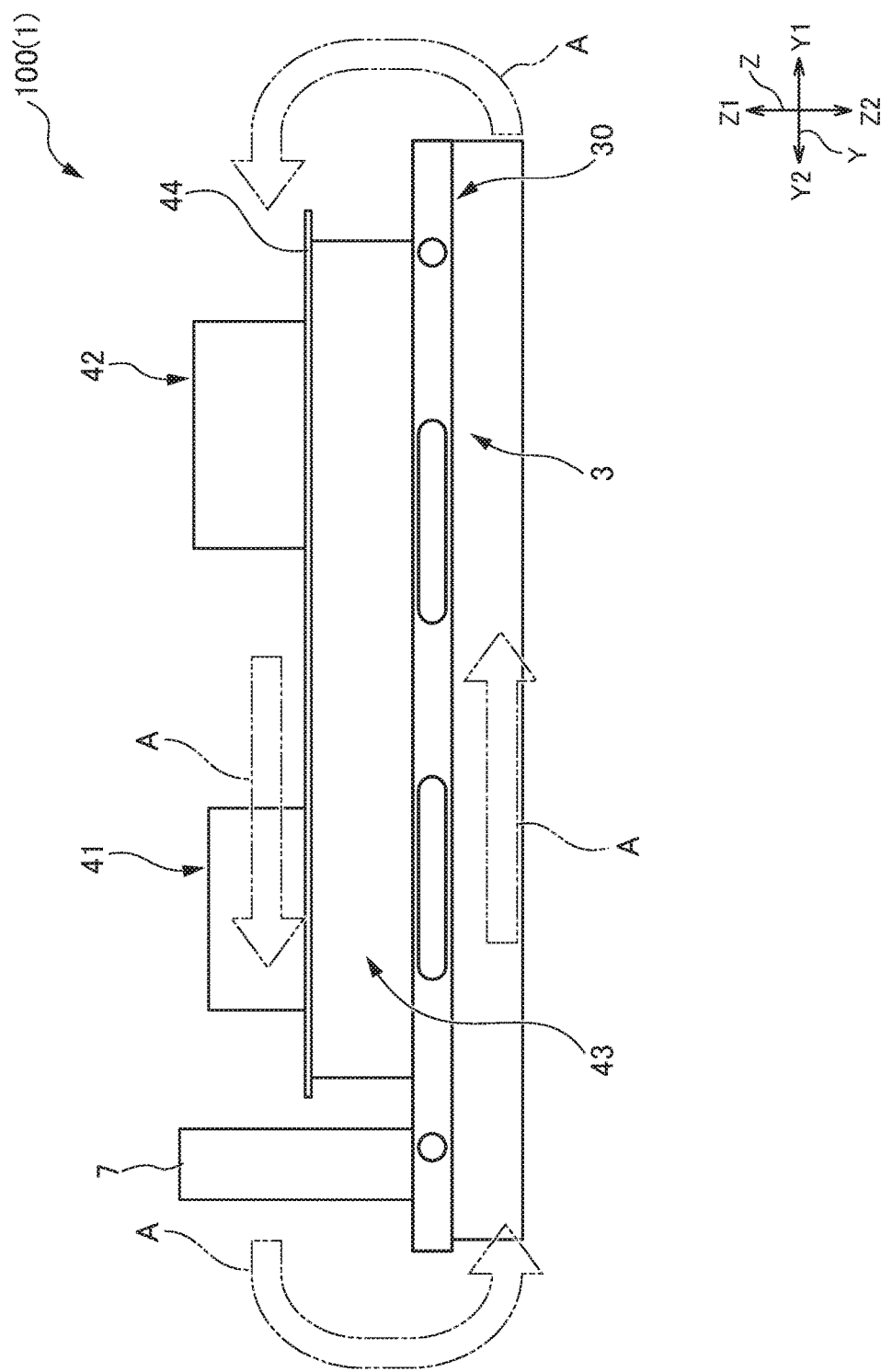
FIG. 5A is a side view when the main body unit 100 shown in FIG. 4 is seen from an X1 side.
Figure 5B:
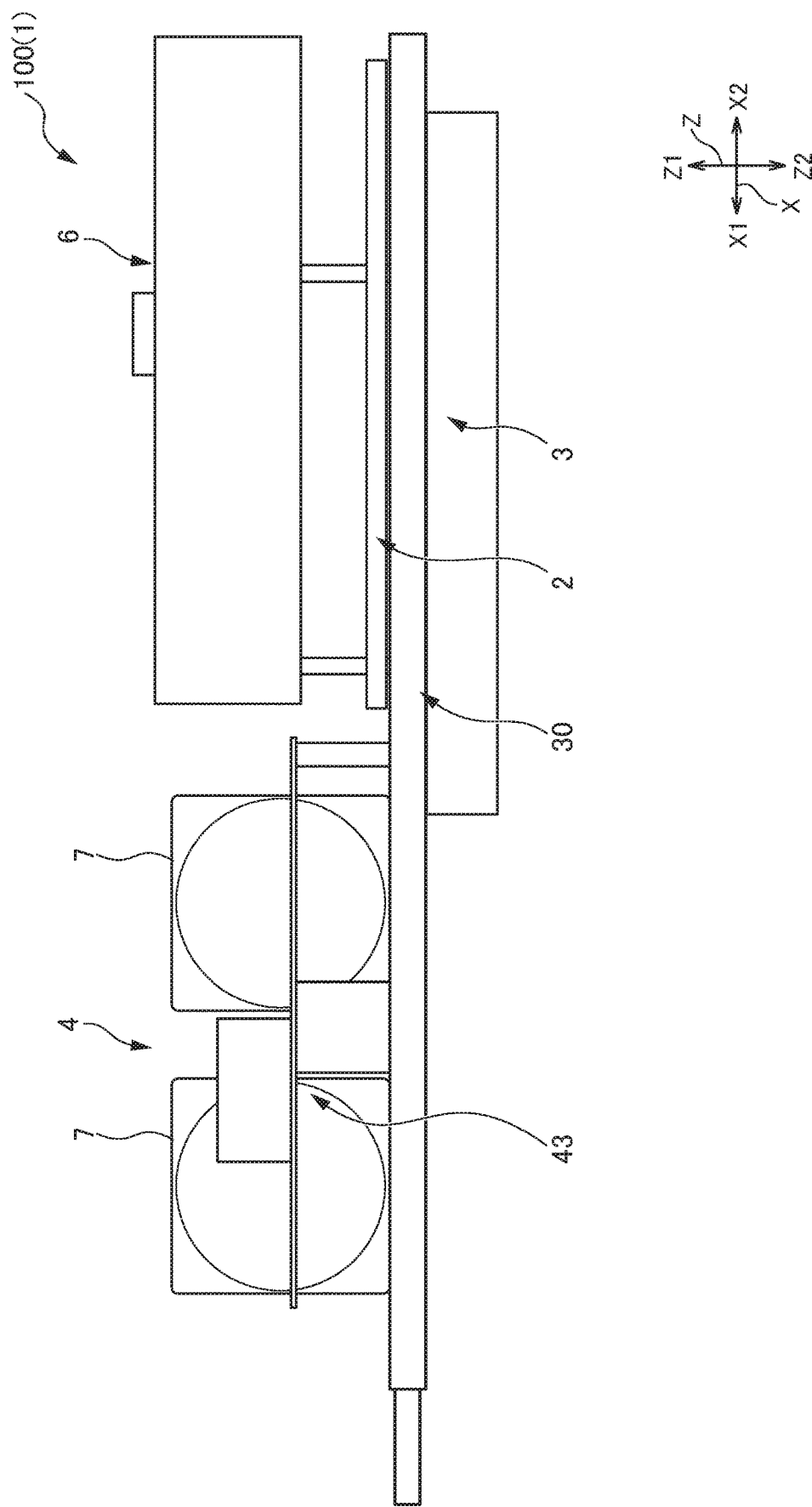
FIG. 5B is a side view when the main body unit 100 shown in FIG. 4 is seen from a Y1 side.

The internal structure of the laser device 1 will then be described. FIG. 3 is an exploded perspective view showing the appearance of the laser device 1. FIG. 4 is a plan view showing the main body unit 100 of the laser device 1. FIG. 5A is a side view when the main body unit 100 shown in FIG. 4 is seen from the X1 side. FIG. 5B is a side view when the main body unit 100 shown in FIG. 4 is seen from the Y1 side. In the individual drawings showing the internal structure of the laser device 1, the illustration of the electrical cables, the optical fiber cables, connectors, banding bands and the like is omitted as necessary. As is previously described, since the individual drawings are schematic views, the appearances, the size, the arrangement, the number and the like of the individual parts shown in the drawings are different from those of the actual parts.

As shown in FIG. 3, the main body unit 100 of the laser device 1 is stored within the housing 20. The housing 20 includes an outer frame portion 21, a top plate portion 22 and a bottom plate portion 23. The individual portions of the housing 20 are formed of, for example, an aluminum alloy, stainless steel, steel plates or the like. The outer frame portion 21 is the portion which forms the main body of the housing 20. The outer frame portion 21 includes side plates 211, 212, 213 and 214. The side plate 211 is a plate member of the outer frame portion 21 which is located on the X1 side. The side plate 212 is a plate member of the outer frame portion 21 which is located on the X2 side. The side plate 213 is a plate member of the outer frame portion 21 which is located on the Y1 side. The side plate 214 is a plate member of the outer frame portion 21 which is located on the Y2 side. The side plates 211 to 214 are connected to each other with screws (unillustrated) so as to fotin a frame shape.

The top plate portion 22 is the plate member which is located on the Z1 side of the outer frame portion 21. The bottom plate portion 23 is the plate member which is located on the Z2 side of the outer frame portion 21. The top plate portion 22 and the bottom plate portion 23 are respectively connected with screws (unillustrated) to the side edge 21a of the outer frame portion 21 on the Z1 side and the side edge 21b of the outer frame portion 21 on the Z2 side. The top plate portion 22 and the bottom plate portion 23 are attached to the outer frame portion 21, and thus the interior of the housing 20 is brought into an enclosed state.

In a normal usage form of the laser device 1, the thickness direction (Z direction) does not necessarily coincide with a vertical direction. For example, when a plurality of laser devices 1 are stored so as to be arranged in a rack, they may be arranged such that the thickness direction coincides with a horizontal direction. Although in the present embodiment, for ease of description, with reference to the arrangement shown in FIG. 3, the "top plate portion" and the "bottom plate portion" are described, their names do not limit an up/down direction in the usage form of the laser device 1.

As shown in FIG. 4, in the main body unit 100, the power supply unit 4 and the laser light control unit 6 are arranged in parallel on the X-Y plane. The power supply unit 4 includes, as shown in FIG. 5A, the coil 41, the capacitor 42 and the switching element 43. Among them, the coil 41 and the capacitor 42 are arranged on the Z1 side of a printed board 44. The coil 41 and the capacitor 42 are cooled (air-cooled) by the air which is circulated within the housing 20. The switching element 43 is arranged on the Z2 side of the printed board 44. As shown in FIG. 5A, the switching element 43 is in contact with the first cooling surface 30a which is the Z1 side of the water cooling plate 30. In other words, the switching element 43 is cooled by the water cooling plate 30.

In the main body unit 100, as shown in FIG. 5B, the LD module 2 is arranged on the first cooling surface 30a which is the Z1 side of the water cooling plate 30. In the main body unit 100, as shown in FIG. 5B, the cavity 3 is arranged on the second cooling surface 30b which is the Z2 side of the water cooling plate 30.

Figure 6:
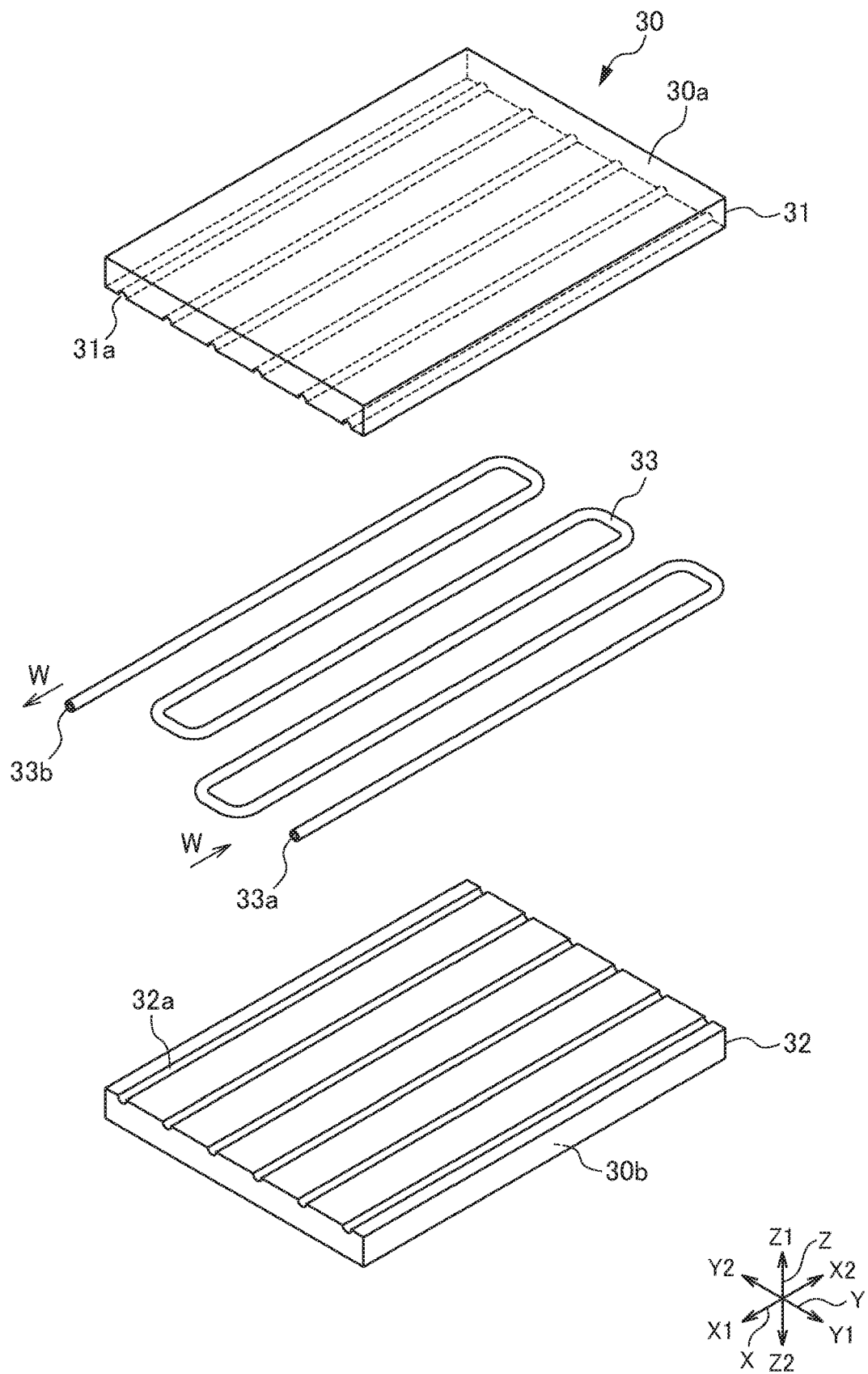
FIG. 6 is an exploded perspective view of a water cooling plate 30.

The configuration of the water cooling plate 30 will then be described. FIG. 6 is an exploded perspective view of the water cooling plate 30. As shown in FIG. 6, the water cooling plate 30 includes a first cooling plate 31, a second cooling plate 32 and a cooling pipe 33. The first cooling plate 31 is the plate-shaped member which forms the first cooling surface 30a described above. The first cooling plate 31 includes an arrangement groove 31a. The arrangement groove 31a is the groove in which the cooling pipe 33 is stored. The arrangement groove 31a is formed along the longitudinal direction (X direction) of the first cooling plate 31.

The second cooling plate 32 is the plate-shaped member which forms the second cooling surface 30b described above. The second cooling plate 32 includes an arrangement groove 32a. The arrangement groove 32a is the groove in which the cooling pipe 33 is stored. The arrangement groove 32a is formed along the longitudinal direction (X direction) of the second cooling plate 32. The first cooling plate 31 and the second cooling plate 32 are formed of, for example, a material such as an aluminum alloy or a copper alloy which has a high thermal conductivity.

The cooling pipe 33 is the pipe-shaped member within which cooling water W is circulated. The cooling pipe 33 is formed of, for example, a material such as copper which has a high thermal conductivity. Although not shown in the figure, one end portion 13a and the other end portion 13b of the cooling pipe 33 are extended to the side surface of the housing 20 on the X1 side. A coupler (unillustrated) is attached to the side surface of the housing 20 on the X1 side. The cooling pipe 33 is connected through the coupler to an external pipe (unillustrated) which is extended from a heat exchanger.

The cooling pipe 33 is sandwiched between the arrangement groove 31a of the first cooling plate 31 and the arrangement groove 32a of the second cooling plate 32, both the cooling plates 31 and 32 are joined and thus the water cooling plate 30 is formed. As shown in FIG. 6, the cooling water W is supplied from the heat exchanger (unillustrated) to one end 33a of the cooling pipe 33. The cooling water W supplied to the cooling pipe 33 is circulated within the cooling pipe 33 so as to absorb (heat exchange) the heat of the first cooling surface 30a of the first cooling plate 31 and the second cooling surface 30b of the second cooling plate 32, and is fed out from the other end portion 33b to the heat exchanger.

When in the water cooling plate 30 configured as described above, a crack or the like occurs in the cooling pipe 33 or a joint failure, a crack or the like occurs between the first cooling plate 31 and the second cooling plate 32, the cooling water W may leak from the water cooling plate 30 to the outside. When such a water leakage occurs, the cooling performance of the portion in which the water leakage occurs is lowered, and thus it is impossible to appropriately cool the heat-generating parts. Hence, as will be described later, in individual portions of the water cooling plate 30, the temperature sensors 17a to 17g are arranged. Although in the present embodiment, the water cooling plate of the sandwiching type is described, a water cooling plate of another structure such as a pipe extension type may be adopted.

The arrangement of the fan motor 7, the humidity sensor 16 and the temperature sensors 17 will then be described. As shown in FIG. 4, the two fan motors 7 are provided in an end portion on the Y2 side with respect to the power supply unit 4 on the first cooling surface 30a of the water cooling plate 30. The two fan motors 7 are arranged in parallel along the X direction. The fan motors 7 of the present embodiment are provided in the vicinity of the power supply unit 4 which includes the parts having high heat generation. Specifically, the fan motors 7 are provided a distance of about several to ten and several mm away from the end of the coil 41 (the power supply unit 4) in the Y2 direction. The distance between the fan motors 7 and the power supply unit 4 is preferably minimized so that heat (discharged heat) generated in the power supply unit 4 is efficiently utilized. The fan motors 7 are provided in the vicinity of the power supply unit 4, and thus air A warmed by the heat of the power supply unit 4 (in this example, the coil 41) can be fed out into the housing 20.

As shown in FIG. 4, the fan motors 7 feed out the air A sucked from the Y1 side to the Y2 side. As shown in FIG. 3, on the Y2 side of the fan motors 7, the side plate 214 of the outer frame portion 21 is arranged. Hence, the air A fed out from the fan motors 7 to the Y2 side is moved along the side plate 214 to the Z2 side and is further moved along the bottom plate portion 23 in the Y1 direction. The air A moved in the Y1 direction is moved along the side plate 213 of the outer frame portion 21 to the Z1 side and is moved along the top plate portion 22 so as to reach the Y2 side of the fan motors 7 again. As described above, the air A within the housing 20 is circulated so as to be turned around the power supply unit 4 and the water cooling plate 30. In FIG. 5A, the side plates and the like are omitted, and the path along which the air A described above is moved is schematically shown.

As shown in FIG. 4, the humidity sensor 16 is provided substantially in the center of the laser light control unit 6. The humidity sensor 16 is provided in a position away from the distribution path of the air A sucked by the fan motors 7 and the air A fed out from the fan motors 7. The position away from the distribution path of the air A refers to the position in which the humidity sensor 16 is not in direct contact with the flow of the air A. As an example, the humidity sensor 16 is provided in a position about several to ten and several cm away from regions on the windward side and the leeward side of the fan motors 7. The humidity sensor 16 is provided in the position away from the distribution path of the air A, and thus the humidity sensor 16 is little affected by the warmed air A, with the result that it is possible to accurately detect a variation in the humidity caused by a small amount of water leaking from the water cooling plate 30. The humidity (environmental humidity) detected in the humidity sensor 16 within the housing 20 is transmitted through the electrical cable (unillustrated) to the detection control unit 14 (see FIG. 2).

Figure 7:
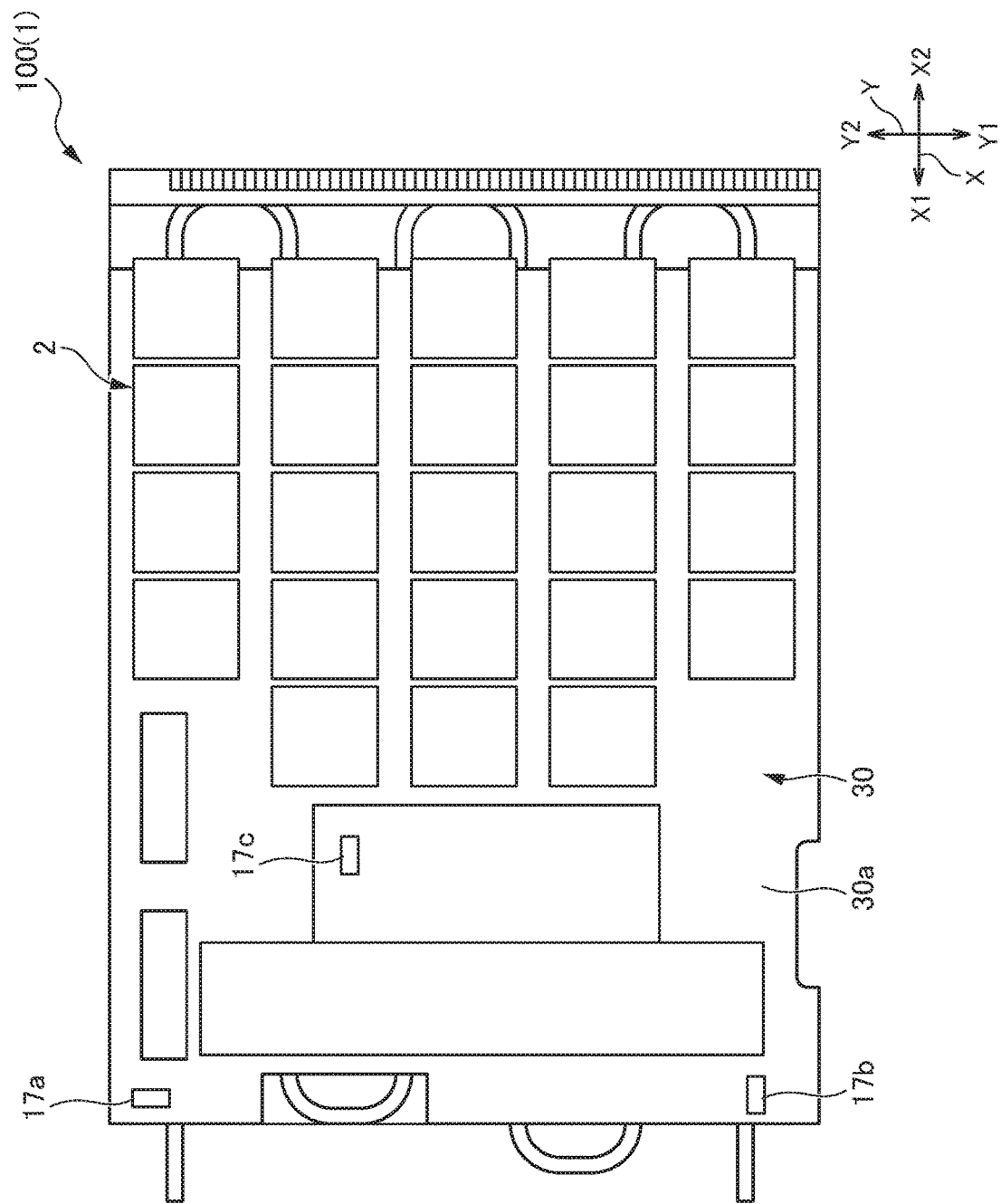
FIG. 7 is a plan view of the main body unit 100 from which a power supply unit 4 and a laser light control unit 6 are removed.
Figure 8:
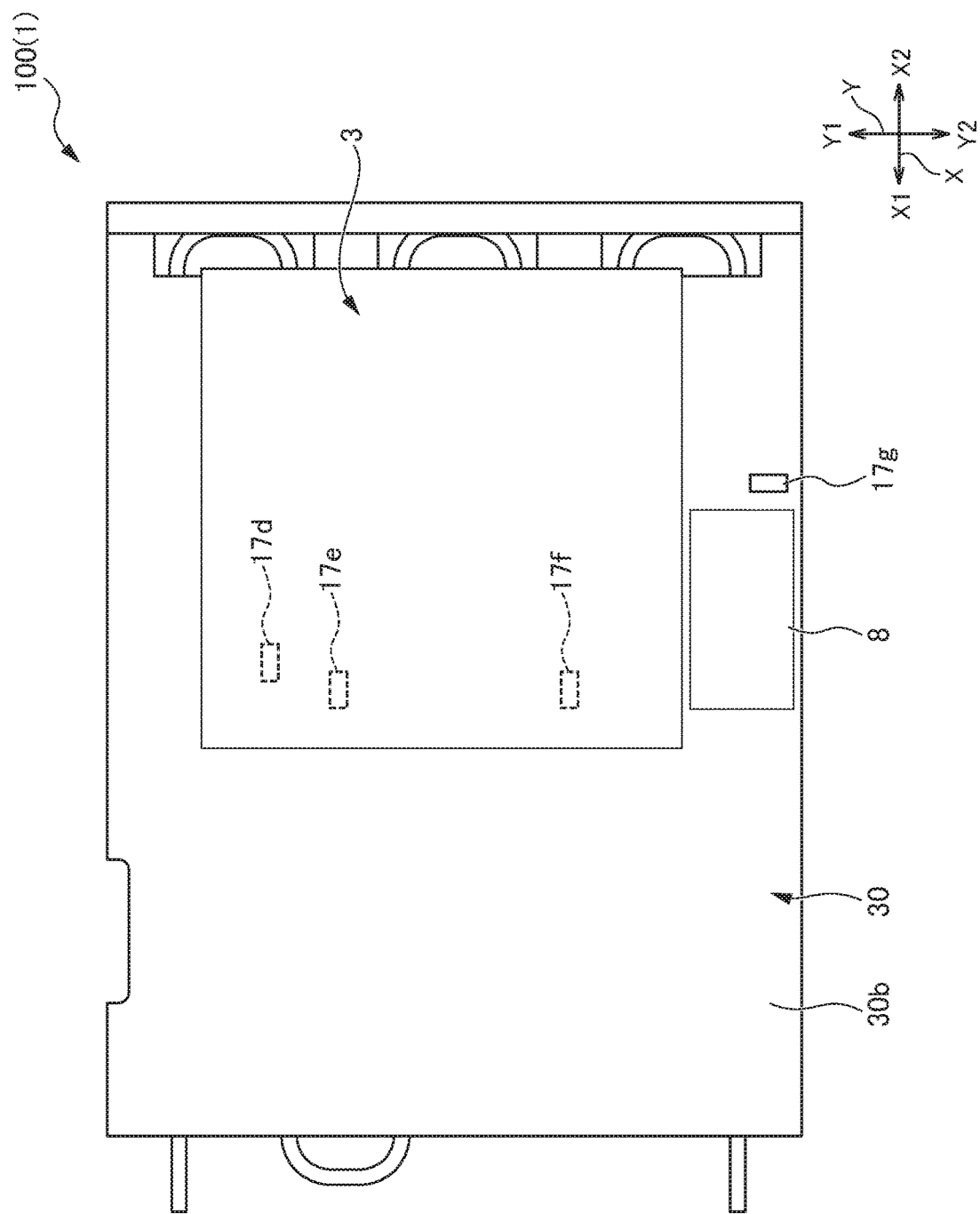
FIG. 8 is a plan view when the main body unit 100 is seen from a Z2 side.

The arrangement of the temperature sensors 17 will then be described. FIG. 7 is a plan view of the main body unit 100 from which the power supply unit 4 and the laser light control unit 6 are removed. FIG. 8 is a plan view when the main body unit 100 is seen from the Z2 side. As described previously, the laser device 1 of the present embodiment includes, as the temperature sensors 17, the seven temperature sensors 17a to 17g. A portion of the temperature sensors 17a to 17g is provided in the vicinity of the parts having high heat generation among the part group arranged on the water cooling plate 30. The vicinity of the parts having high heat generation includes not only a case where the temperature sensors 17 are in direct contact with the parts having high heat generation but also, for example, a case where the temperature sensors 17 are separated about several to ten and several mm away from the parts having high heat generation.

As shown in FIG. 7, the temperature sensor 17a is provided in an end portion of the first cooling surface 30a of the water cooling plate 30 on the X1 side and the Y2 side. The temperature sensor 17b is provided in an end portion of the first cooling surface 30a of the water cooling plate 30 on the X1 side and the Y1 side. The temperature sensor 17c is provided in a position overlapping the power supply unit 4 (see FIG. 4) in plan view on the first cooling surface 30a of the water cooling plate 30. In this position, the switching element 43 (heat-generating part) of the power supply unit 4 is arranged.

As shown in FIG. 8, the temperature sensors 17d to 17f are provided on the second cooling surface 30b of the water cooling plate 30 within the cavity 3 (heat-generating part). The temperature sensor 17g is provided in the vicinity of the optical parts 8 (heat-generating parts) arranged beside the cavity 3 on the second cooling surface 30b of the water cooling plate 30. The temperatures (partial temperatures) detected in the temperature sensors 17a to 17g within the housing 20 are transmitted through the electrical cables (unillustrated) to the detection control unit 14 (see FIG. 2).

Figure 9:
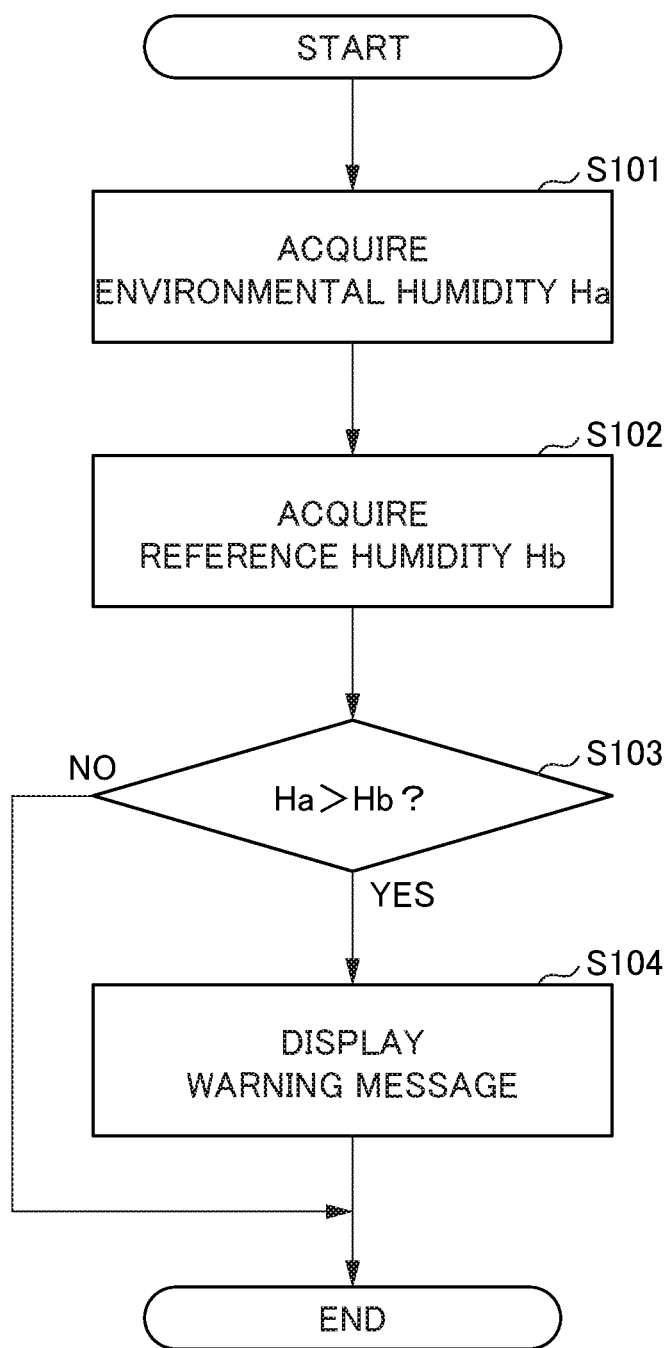
FIG. 9 is a flowchart showing a procedure for water leakage detection processing performed with a humidity sensor 16 in the water leakage detection system 10.

A procedure for the water leakage detection processing performed with the water leakage detection system 10 discussed above will then be described. FIG. 9 is a flowchart showing the procedure for the water leakage detection processing performed with the humidity sensor 16 in the water leakage detection system 10. The water leakage detection processing shown in FIG. 9 is repeatedly performed at intervals of, for example, several seconds to several minutes while the laser device 1 is being operated.

In step S101 shown in FIG. 9, the detection control unit 14 acquires, as the environmental humidity Ha, the humidity detected with the humidity sensor 16 provided in the laser device 1. In step S102, the detection control unit 14 acquires the reference humidity Hb stored in the storage unit 13.

In step S103, the detection control unit 14 determines whether or not the environmental humidity Ha exceeds the reference humidity Hb. When in step S103, the detection control unit 14 determines that the environmental humidity Ha does not exceed the reference humidity Hb (no), the processing of the present flowchart is completed. On the other hand, in step S103, the detection control unit 14 determines that the environmental humidity Ha exceeds the reference humidity Hb (yes), the processing is transferred to step S104.

In step S104 (step S103: yes), the control unit 104 makes the display unit 11 display the warning message. Thereafter, the processing of the present flowchart is completed. In this way, the manager of the laser device 1 can confirm the occurrence of the water leakage within the laser device 1. The display of the warning message displayed on the display unit 11 may be completed a predetermined time later or may be completed when an operator inputs a cancellation operation. A warning sound may be produced together with the warning message. The same is true in the water leakage detection processing performed with the temperature sensors 17 which will be described later.

Figure 10:
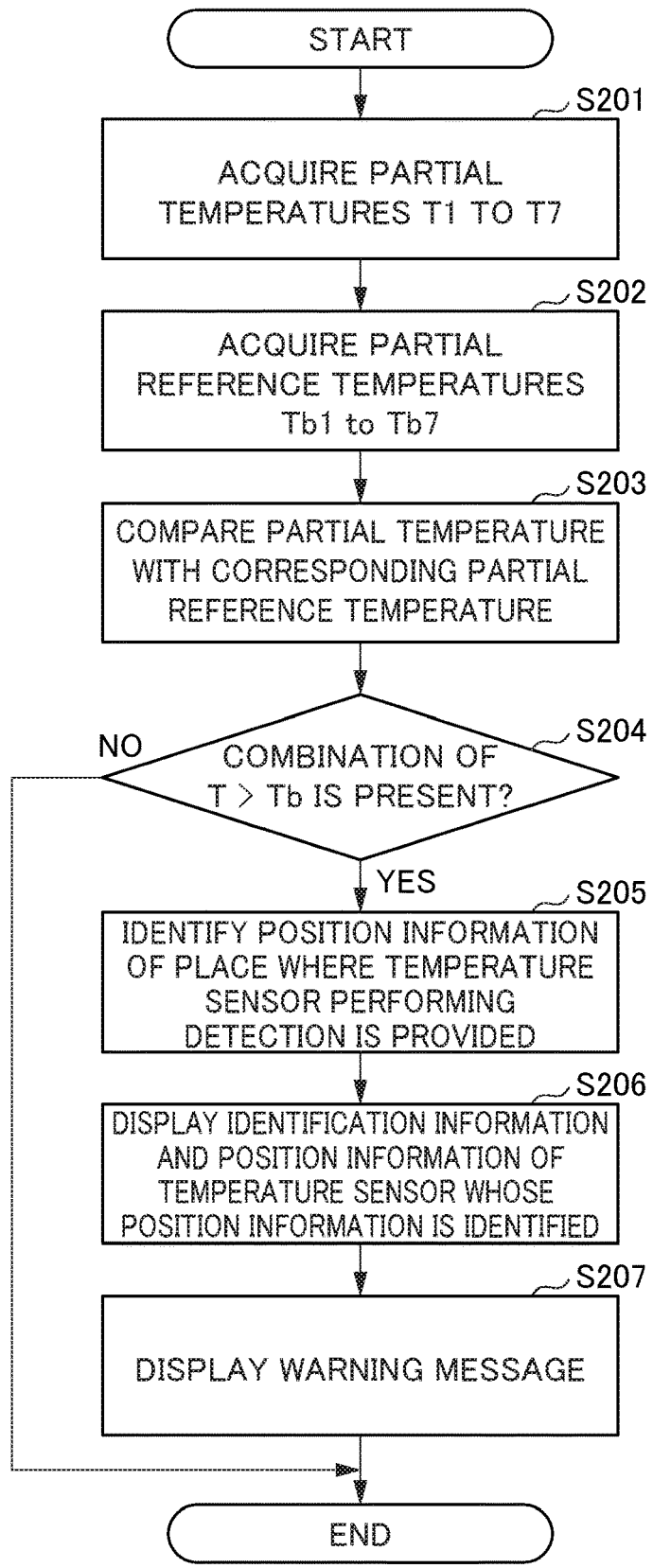
FIG. 10 is a flowchart showing a procedure for water leakage detection processing performed with temperature sensors 17 in the water leakage detection system 10.

FIG. 10 is a flowchart showing a procedure for the water leakage detection processing performed with the temperature sensors 17 in the water leakage detection system 10. The water leakage detection processing shown in FIG. 10 is repeatedly performed at intervals of, for example, several seconds to several minutes while the laser device 1 is being operated.

In step S201 shown in FIG. 10, the detection control unit 14 acquires, as the partial temperatures T1 to T7, the temperatures detected in the temperature sensors 17a to 17g provided in the individual places of the laser device 1. In step S202, the detection control unit 14 acquires the partial reference temperatures Tb1 to Tb7 stored in the storage unit 13.

In step S203, the detection control unit 14 compares the partial temperatures T1 to T7 with the corresponding partial reference temperatures Tb1 to Tb7. In step S204, the detection control unit 14 determines whether or not there is a combination in which the partial temperature T exceeds the partial reference temperature Tb. When in step S204, the detection control unit 14 determines that there is no combination in which the partial temperature T exceeds the partial reference temperature Tb (no), the processing of the present flowchart is completed. On the other hand, in step S204, the detection control unit 14 determines that there is a combination in which the partial temperature T exceeds the partial reference temperature Tb (yes), the processing is transferred to step S205.

In step S205 (step S204: yes), based on the identification information allocated to the temperature sensor 17 which detects the partial temperature T exceeding the partial reference temperature Tb, the detection control unit 14 identifies the position information of the place where the temperature sensor 17 is provided. In step S206, the detection control unit 14 makes the display unit 11 display the identification information and the position information of the temperature sensor 17 whose position information is identified. In this way, the manager can confirm, without disassembling the laser device 1, the temperature sensor detecting the water leakage and the place where the water leakage occurs within the laser device 1. In step S206, only the position information of the temperature sensor 17 whose position information is identified may be displayed on the display unit 11.

In step S207, the detection control unit 14 makes the display unit 11 display the warning message. Thereafter, the processing of the present flowchart is completed. In the water leakage detection processing, the processing in step S207 may be performed before step S206 or the processing in step S206 and the processing in step S207 may be performed simultaneously.

The water leakage detection processing performed with the humidity sensor 16 and the water leakage detection processing performed with the temperature sensors 17 are performed in the detection control unit 14 at the same time. Hence, when the water leakage occurs, even if it takes much time to detect the water leakage in the water leakage detection processing performed with the humidity sensor 16, it is possible to detect the water leakage in the water leakage detection processing performed with the temperature sensors 17 in an early stage. When the water leakage occurs, even if it takes much time to detect the water leakage in the water leakage detection processing performed with the temperature sensors 17, it is possible to reliably detect the water leakage in the water leakage detection processing performed with the humidity sensor 16.

As described above, in the water leakage detection system 10 of the present embodiment, the air warmed by the heat of the parts having high heat generation is circulated with the fan motors 7 within the housing 20, and thus a deviation in the humidity within the housing 20 is made uniform, with the result that a variation in the humidity caused by a small amount of water leaking can be detected in an early stage. In this way, even when the water leakage occurs, before the amount of water leaking within the laser device 1 is increased, the water leakage can be detected, with the result that it is possible to avoid a failure in which the part group arranged therewithin fails or is damaged. It is also possible to reduce the number of alarm stops (emergency stops) caused by failures in the part group arranged therewithin. Furthermore, after the water leakage is detected and repair or the like is performed, the warmed air fed out from the fan motors 7 is circulated, and thus a small amount of water droplet which cannot be wiped away in the repair can be rapidly removed from the surface of the parts, with the result that it is possible to restore the laser device 1 in an early stage.

In the water leakage detection system 10 of the present embodiment, in the vicinity of the heat-generating parts (in the present embodiment, the coil 41) which are difficult to cool because the heat-generating parts are installed in places away from the water cooling plate 30, the fan motors 7 are provided, with the result that these heat-generating parts can be effectively cooled (air-cooled). The location of the fan motors 7 is not limited to positions in the vicinity of the coil 41 as in the present embodiment, and as long as the fan motors 7 are located in the vicinity of the heat-generating parts which are difficult to cool with the water cooling plate 30, the fan motors 7 may be provided in any positions.

In the water leakage detection system of the present embodiment, since the water leakage detection is performed based on the temperatures acquired from the temperature sensors 17 arranged in a plurality of places in the water cooling plate 30, even when water leaks in any position of the water cooling plate 30, it is possible to detect the water leakage in an early stage and accurately. In the water leakage detection system, the position information of the temperature sensor 17 in which the detected partial temperature exceeds the partial reference temperature is displayed on the display unit 11 together with the warning message, and thus the manager can confirm the place of the water leakage within the housing 20 without disassembling the laser device 1. Hence, the manager can rapidly perform an operation of repairing the place of the water leakage and an operation of replacing the parts.

In the water leakage detection system of the present embodiment, the fan motors 7 are provided in the vicinity of the coil 41 which is the heat-generating part. Hence, without provision of a heating part or the like for warming the air, the warmed air can be fed out from the fan motors 7.

In the water leakage detection system of the present embodiment, the humidity sensor 16 is provided in the position away from the distribution path of the air sucked by the fan motors 7 and the air fed out from the fan motors 7. In this way, the air is unlikely to be brought into direct contact with the humidity sensor 16, and thus it is possible to more accurately detect the humidity in the humidity sensor 16.

In the water leakage detection system of the present embodiment, a portion of the temperature sensors 17 is provided in the vicinity of the heat-generating part (for example, the power supply unit 4) among the part group arranged on the water cooling plate 30. In this way, when in the water cooling plate 30, water leaks in the place where the heat-generating part is provided or in the vicinity thereof, the temperature in the place of the water cooling plate 30 is raised more rapidly than the other places, and thus it is possible to detect the water leakage in the water cooling plate 30 in an early stage.

Although the embodiment of the present invention is described above, the present invention is not limited to the embodiment described above, various variations and modifications such as variations which will be described below are possible and they are also within the technical scope of the present invention. The effects described in the embodiment are simply a list of the most preferred effects produced from the present invention, and there is no limitation to the effects described in the embodiment. Although the embodiment described above and the variations which will be described below can be combined as necessary so as to be used, the detailed description thereof will be omitted.

(Variations)

Although in the embodiment, the example where the one humidity sensor 16 is provided within the laser device 1 is described, there is no limitation to this configuration. A plurality of humidity sensors 16 may be arranged, and the average value or the maximum value of detected humidity values may be used as the environmental humidity (Ha). Although in the embodiment, the example where a portion of the temperature sensors 17 (17a to 17g) is arranged in the vicinity of the heat-generating part is described, there is no limitation to this configuration. All the temperature sensors 17 may be arranged in the vicinity of the heat-generating part or may not be arranged in the vicinity of the heat-generating part.

Although in the embodiment, the example where the humidity sensor 16 is provided in the position away from the distribution path of the air sucked by the fan motors 7 and the air fed out from the fan motors 7 is described, there is no limitation to this configuration. For example, a duct is provided on the windward side or the leeward side of the fan motors 7, and thus it is possible to physically partition the distribution path of the air sucked by the fan motors 7 or the air fed out from the fan motors 7 and the other parts. In such a case, the humidity sensor 16 can be provided in the vicinity of the fan motors.

Although in the embodiment, the example where the fan motors 7 are provided in the vicinity of the coil 41 is described, there is no limitation to this configuration. As long as the fan motors 7 are provided in the vicinity of the parts having high heat generation, they may be in the vicinity of the other parts. For example, the fan motors 7 may be provided in the vicinity of the capacitor 42.

Although in the embodiment, the example where the fan motors 7 are used as an air circulating unit is described, there is no limitation to this configuration. Instead of the fan motor 7, a blower, a cross flow fan or the like may be used. The number of fan motors 7 is not limited to two, and may be one or three or more.

Although in the embodiment, the example where the direction of the air of the fan motors 7 is the Y2 direction (see FIG. 4) is described, there is no limitation to this configuration. The direction of the air of the fan motors 7 may be the X direction or the Z direction. In other words, as long as the direction of the air of the fan motors 7 makes it possible to circulate the air within the housing 20, the direction of the air of the fan motors 7 may be any direction.

EXPLANATION OF REFERENCE NUMERALS

1: laser device, 2: LD module, 3: cavity, 7: fan motor, 10: water leakage detection system, 11: display unit, 13: storage unit, 14: detection control unit, 16: humidity sensor, 17 (17a to 17g): temperature sensors, 20: housing, 30: water cooling plate, 100: main body unit, A: air, W: cooling water

What is claimed is:

1. A water leakage detection system for a laser device that detects a water leakage in the laser device including: a part group for outputting laser light; a water cooling plate which cools a laser diode module, a cavity, and a power supply unit among the part group; an enclosed housing in which the part group and the water cooling plate are stored; and an air circulating unit which circulates air within the housing,
   wherein the air circulating unit is provided in a vicinity of at least one of the laser diode module, the cavity, and the power supply unit among the part group, and
   the power supply unit is configured such that a coil and a capacitor are provided on a first surface of a printed board, a switching element is provided on the first surface and a second surface that is opposite to the first surface of the printed board, and the switching element is in contact with the water cooling plate,
   the water leakage detection system for the laser device includes:
   a humidity detection unit which detects humidity within the housing;
   a temperature detection units which are arranged in a plurality of places in the water cooling plate and which respectively detect temperatures of the places; and
   a control unit which outputs detection information when the humidity acquired from the humidity detection unit exceeds reference humidity or when at least one of the temperatures acquired from the temperature detection units exceeds a reference temperature of the corresponding place.

2. The water leakage detection system for the laser device according to claim 1, wherein the air circulating unit includes a mechanism in which air sucked within the housing is fed out into the housing, and
   the humidity detection unit is provided in a position away from a distribution path of the air sucked by the air circulating unit and the air fed out from the air circulating unit.

3. The water leakage detection system for the laser device according to claim 1, wherein the temperature detection units are respectively provided in a vicinity of at least one of the laser diode module, the cavity, and the power supply unit among the part group arranged on the water cooling plate.

4. The water leakage detection system for the laser device according to claim 1, wherein when at least one of the temperatures acquired from the temperature detection units exceeds the reference temperature of the corresponding place, the control unit outputs, together with the detection information, position information associated with the temperature detection unit that detects the temperature exceeding the reference temperature.

\* \* \* \* \*